(12) United States Patent
Hsieh et al.

(10) Patent No.: US 9,711,657 B2
(45) Date of Patent: Jul. 18, 2017

(54) SILICIDE PROCESS USING OD SPACERS

(71) Applicant: Taiwan Semiconductor Manufacturing Company, Ltd., Hsin-Chu (TW)

(72) Inventors: Ping-Pang Hsieh, Tainan (TW); Chih-Ming Lee, Tainan (TW); Yu-Jen Chen, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/043,927

(22) Filed: Feb. 15, 2016

(65) Prior Publication Data

US 2016/0163875 A1 Jun. 9, 2016

Related U.S. Application Data

(62) Division of application No. 13/538,998, filed on Jun. 29, 2012, now Pat. No. 9,263,556.

(51) Int. Cl.
| | |
|---|---|
| *H01L 29/788* | (2006.01) |
| *H01L 29/66* | (2006.01) |
| *H01L 21/762* | (2006.01) |
| *H01L 29/78* | (2006.01) |
| *H01L 27/11521* | (2017.01) |

(52) U.S. Cl.
CPC .... *H01L 29/7883* (2013.01); *H01L 21/76232* (2013.01); *H01L 29/665* (2013.01); *H01L 29/66825* (2013.01); *H01L 29/7853* (2013.01); *H01L 29/7881* (2013.01); *H01L 27/11521* (2013.01)

(58) Field of Classification Search
CPC ........... H01L 29/66825; H01L 29/7881; H01L 29/7853
See application file for complete search history.

(56) References Cited

U.S. PATENT DOCUMENTS

| | | | |
|---|---|---|---|
| 5,949,126 A * | 9/1999 | Dawson | H01L 21/76224 257/396 |
| 6,124,189 A | 9/2000 | Watanabe et al. | |
| 6,171,928 B1 | 1/2001 | Lou | |
| 6,245,637 B1 * | 6/2001 | Tsai | H01L 21/76232 257/E21.549 |
| 6,271,590 B1 | 8/2001 | Akram et al. | |
| 6,509,232 B1 | 1/2003 | Kim | |
| 6,703,271 B2 | 3/2004 | Yeo et al. | |
| 7,091,106 B2 * | 8/2006 | Bonser | H01L 21/76224 257/E21.545 |

(Continued)

*Primary Examiner* — Kyoung Lee
*Assistant Examiner* — Christina Sylvia
(74) *Attorney, Agent, or Firm* — Slater Matsil, LLP

(57) ABSTRACT

A device includes a semiconductor substrate including an active region. The active region includes a first sidewall. An isolation region extends from a top surface of the semiconductor substrate into the semiconductor substrate. The isolation region has a second sidewall, wherein a lower portion of the first sidewall joins a lower portion of the second sidewall to form an interface. A dielectric spacer is disposed on an upper portion of the first sidewall. A silicide region is over and contacting the active region. A sidewall of the silicide region contacts the dielectric spacer, and the dielectric spacer has a top surface substantially lower than a top surface of the silicide region.

20 Claims, 7 Drawing Sheets

(56) References Cited

U.S. PATENT DOCUMENTS

| | | | |
|---|---|---|---|
| 2003/0001196 A1* | 1/2003 | Choi | H01L 27/105 257/315 |
| 2004/0248371 A1 | 12/2004 | Wang | |
| 2005/0260806 A1 | 11/2005 | Chang | |
| 2006/0022280 A1* | 2/2006 | Cabral, Jr. | H01L 21/28097 257/382 |
| 2006/0148181 A1 | 7/2006 | Chan | |
| 2006/0220148 A1* | 10/2006 | Furukawa | H01L 21/3143 257/374 |
| 2007/0254479 A1* | 11/2007 | Fang | H01L 21/28518 438/682 |
| 2010/0025809 A1 | 2/2010 | Bowman | |
| 2011/0193167 A1* | 8/2011 | Fung | H01L 21/26506 257/350 |

* cited by examiner

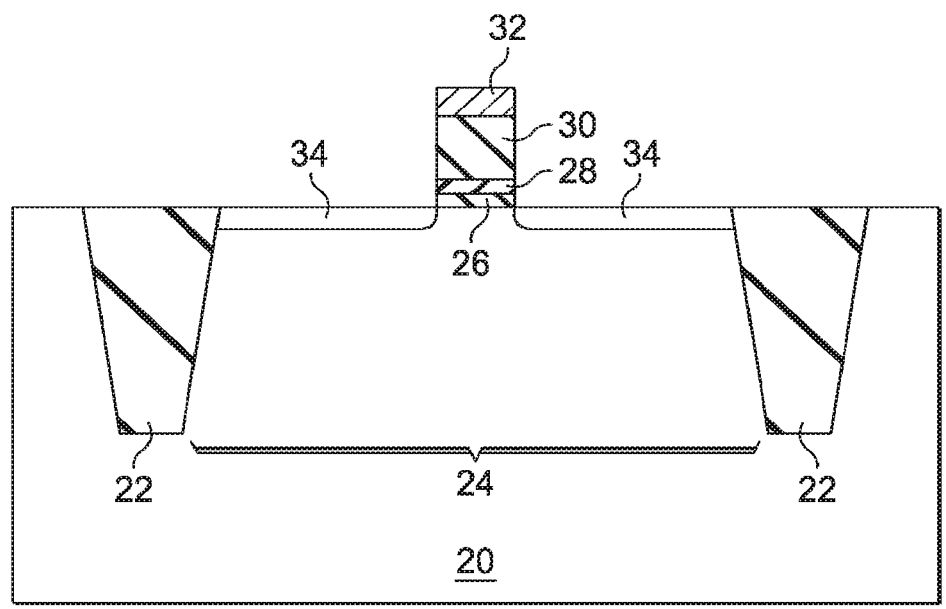
FIG. 3
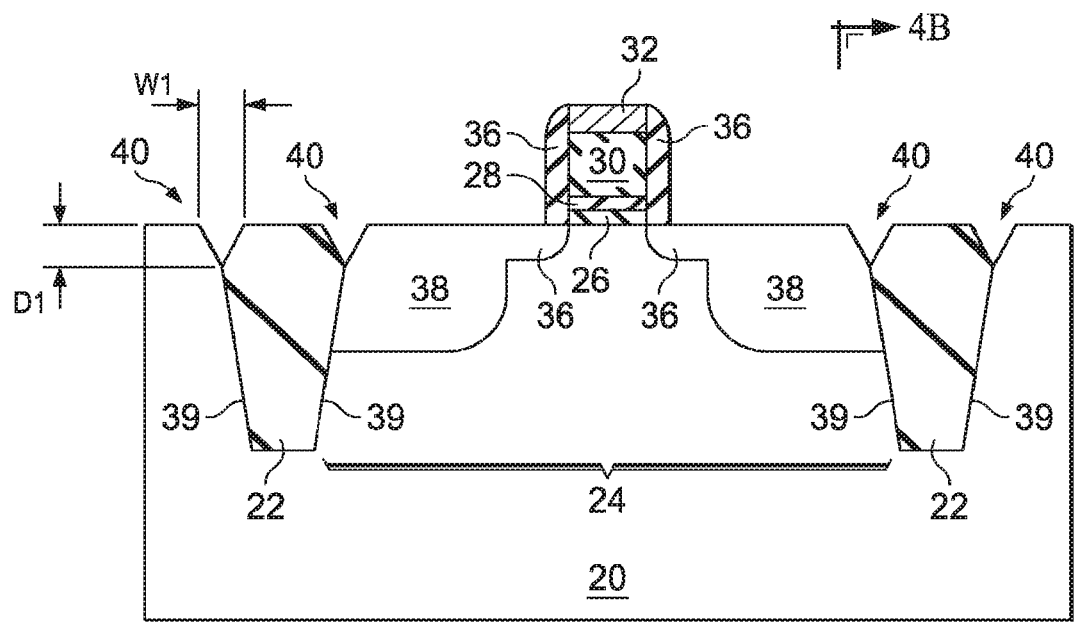

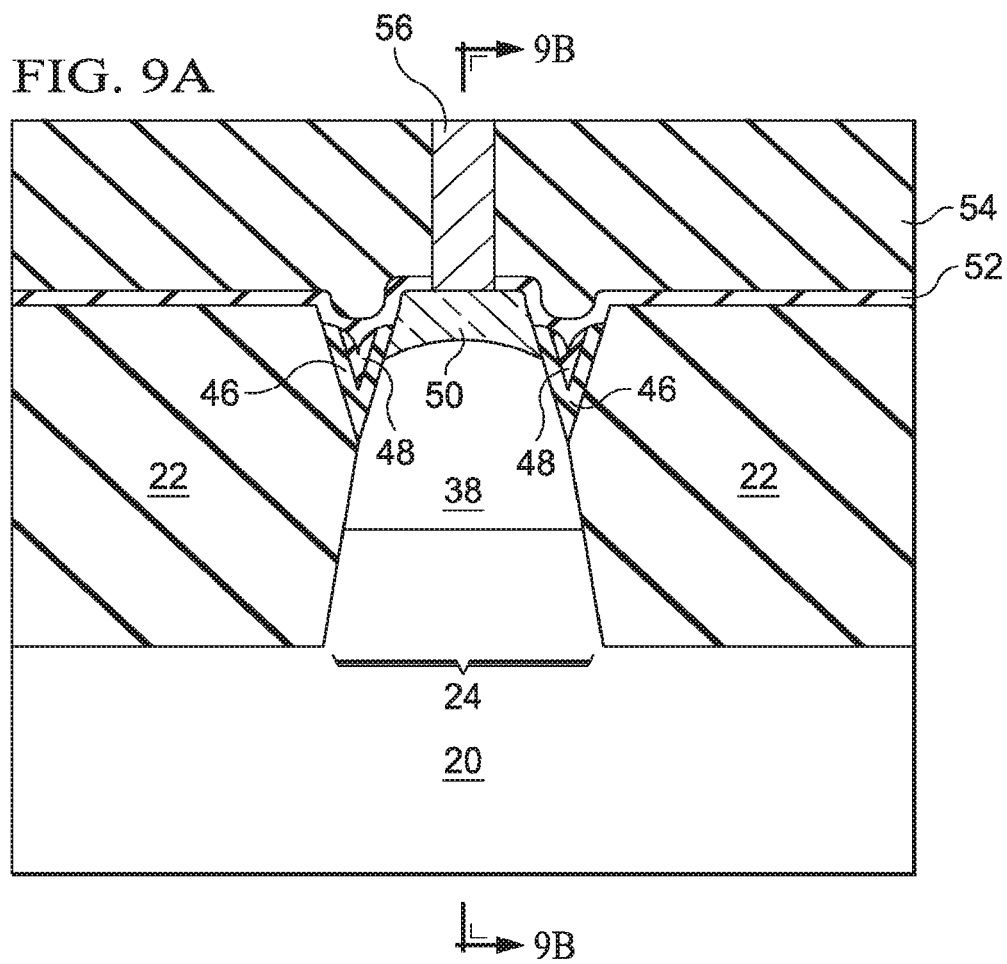

SILICIDE PROCESS USING OD SPACERS

PRIORITY CLAIM AND CROSS-REFERENCE

This application is a divisional application of U.S. patent application Ser. No. 13/538,998, entitled "Silicide Process Using OD Spaces," filed on Jun. 29, 2012, which application is incorporated herein by reference.

BACKGROUND

Flash memories have become increasingly popular in recent years. A typical flash memory comprises a memory array having a large number of memory cells arranged in blocks. Each of the memory cells is fabricated as a field-effect transistor having a control gate and a floating gate. The floating gate is capable of holding charges, and is separated from source and drain regions contained in a substrate by a layer of thin oxide. Each of the memory cells can be electrically charged by injecting electrons from the substrate into the floating gate through the oxide layer. The charges can be removed from the floating gate by tunneling the electrons to the source region or an erase gate during an erase operation. The data stored in flash memory cells are thus determined by the presence or absence of charges in the floating gates. The flash memory cells, however, suffer more from junction leakage currents than non-storage type transistors.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 9B are cross-sectional views of intermediate stages in the manufacturing of a flash memory cell in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A transistor including a silicide region on an active region and the method of forming the same are provided in accordance with various exemplary embodiments. The intermediate stages of forming the transistor are illustrated. The variations of the embodiments are discussed. Throughout the various views and illustrative embodiments, like reference numbers are used to designate like elements. Throughout the description, the formation of a stacked-gate flash memory cell is used as an example. The concept of the embodiments, however, may apply on the formation of other types of transistors such as split-gate flash memory cells, non-storage type transistors, and the like.

Figure 1:
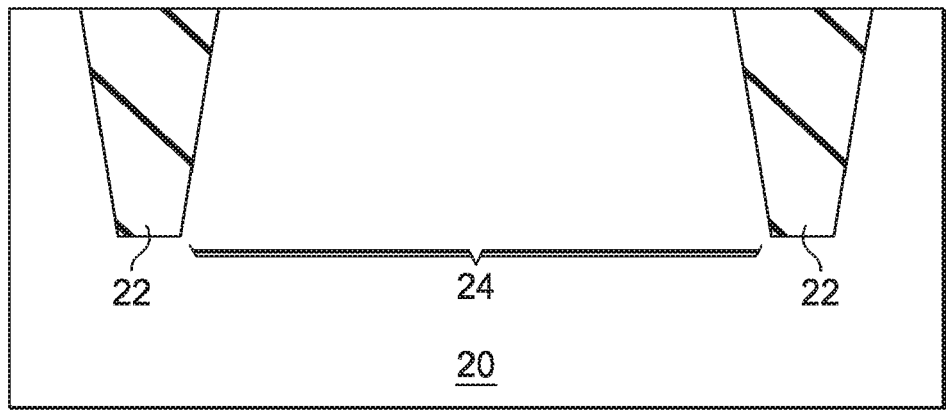

FIGS. 1 through 9B illustrate cross-sectional views of intermediate stages in the manufacturing of a flash memory cell in accordance with some exemplary embodiments. Referring to FIG. 1, substrate 20 is provided. Substrate 20 may be formed of a bulk semiconductor material such as bulk silicon. Alternatively, substrate 20 may comprise germanium, silicon germanium, a III-V compound semiconductor material, or the like. Isolation regions 22, which may be Shallow Trench Isolation (STI) regions, are formed in substrate 20. Accordingly, isolation regions 22 are alternatively referred to as STI regions 22 hereinafter. The process for forming STI regions 22 may include forming trenches in semiconductor substrate 20, filling the trenches with dielectric materials, and then performing a Chemical Mechanical Polish (CMP) to remove excess dielectric materials. The remaining portions of the dielectric materials in the trenches thus form STI regions 22. In some embodiments, STI regions 22 comprise silicon oxide, although other dielectric materials may also be used. Active region 24 is a part of semiconductor substrate 20, and may be between opposite STI regions 22.

Figure 2:
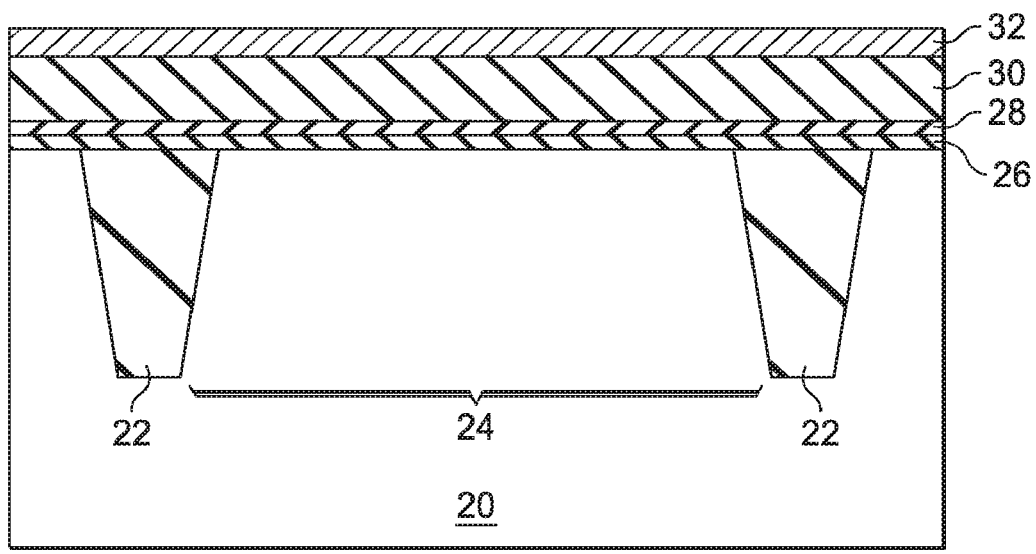

FIG. 2 illustrates stacked layers formed on the substrate 20, wherein the stacked layers include tunneling layer 26 over semiconductor substrate 20, storage layer 28 over tunneling layer 26, blocking layer 30 over storage layer 28, and control gate layer 32 over blocking layer 30. In an exemplary embodiment, tunneling layer 26 comprises an oxide, such as silicon oxide (formed by a thermal oxidation process, for example), $HfO_2$, $Ta_2O_5$, and the like. In other exemplary embodiments, tunneling layer 26 comprises a nitride, an oxynitride, or the like. Storage layer 28, also sometimes referred to as a floating gate layer, may be formed of polysilicon or another conductive material such as a metal or a metal alloy. In alternative embodiments, storage layer 28 is a dielectric layer with a high trap density, which may include silicon nitride, for example. Blocking layer 30, which may include a low-leakage dielectric material, is formed on storage layer 28. Blocking layer 30 may comprise $HfAlO_3$, $HfO_2$, $Ta_2O_5$, $Al_2O_3$, or combinations thereof. Control gate layer 32 may be a doped polysilicon layer, or may comprise a metal, a metal alloy, a metal silicide, or the like. The metal in control gate layer 32 may include iridium, platinum, nickel, palladium, rhodium, or combinations thereof.

The stacked layers 26, 28, 30 and 32 are then patterned, forming a gate stack as shown in FIG. 3. Lightly doped regions (LDD) 34 may then be formed, for example, by implanting an n-type impurity. The gate stack serves as a self-aligning mask so that LDD regions 34 are substantially aligned with the edges of the gate stack.

Figure 4A:
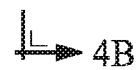
Figure 4B:
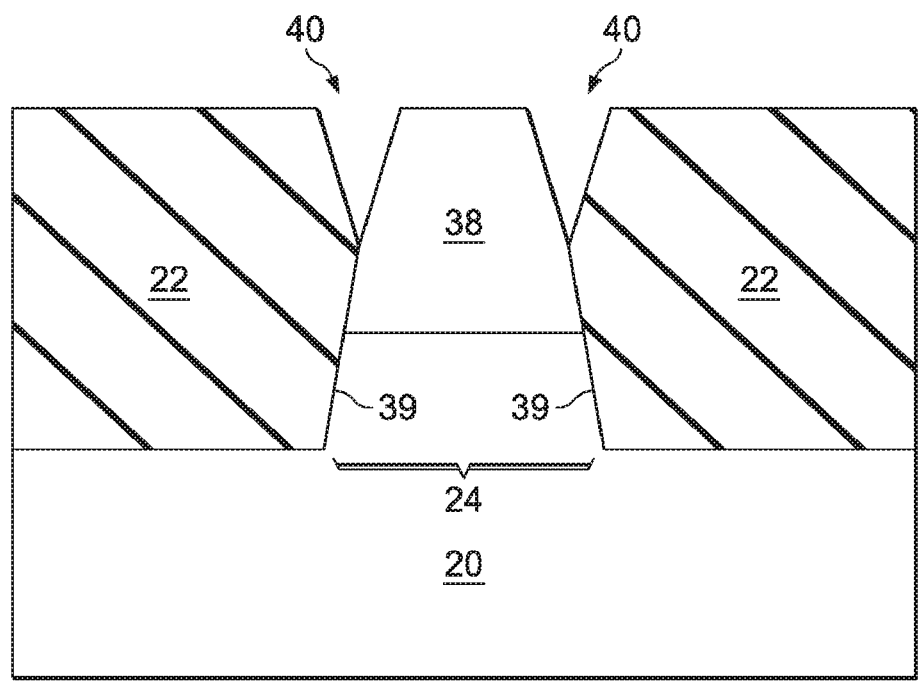

FIGS. 4A and 4B illustrate the formation of gate spacers 36 and source and drain regions 38 (referred to as source/drain regions 38 hereinafter), wherein FIG. 4B illustrates the cross-sectional view obtained from the plane crossing lines 4B-4B in FIG. 4A. As shown in FIG. 4A, gate spacers 36 are formed on the sidewalls of the gate stack, which includes layer 26, 28, 30, and 32. Gate spacers 36 may be formed by blanket depositing a dielectric layer(s) over the entire region, then performing an anisotropic etch to remove horizontal portions of the dielectric, leaving gate spacers 36. In some embodiments, each of gate spacers 36 includes a liner oxide (not shown) and a nitride layer (not shown) over the liner oxide. Source/drain regions 38 are then formed, for example, by implanting into substrate 20 with a p-type or an n-type impurity.

In the structure shown in FIG. 4A, the interface regions of STI regions 22 and active region 24 are recessed, and divots 40 are formed. STI regions 22 and active region 24 comprise sidewalls, wherein the top portions of the sidewalls of STI regions 22 and active region 24 face divots 40, and the bottom portions of the sidewalls of STI regions 22 and active region 24 join each other to form interfaces 39. Divots 40 are thus joined to the top ends of the respective underlying interfaces 39. Divots 40 may be formed as the result of various preceding cleaning processes and etching processes. For example, in the etching process for forming gate spacers 36, STI regions 22 may also be etched, which contributes partially to the formation of divots 40. In some embodiments, divots 40 have depth D1 that is greater than about 40 nm, and may be between about 5 nm and about 60 nm. Width W1 of divots 40 may be greater than about 30 nm, and may be between about 30 nm and about 100 nm. It is appreciated, however, that the values recited throughout the description are merely examples, and may be changed to different values, for example, depending on the process conditions.

Figure 5:
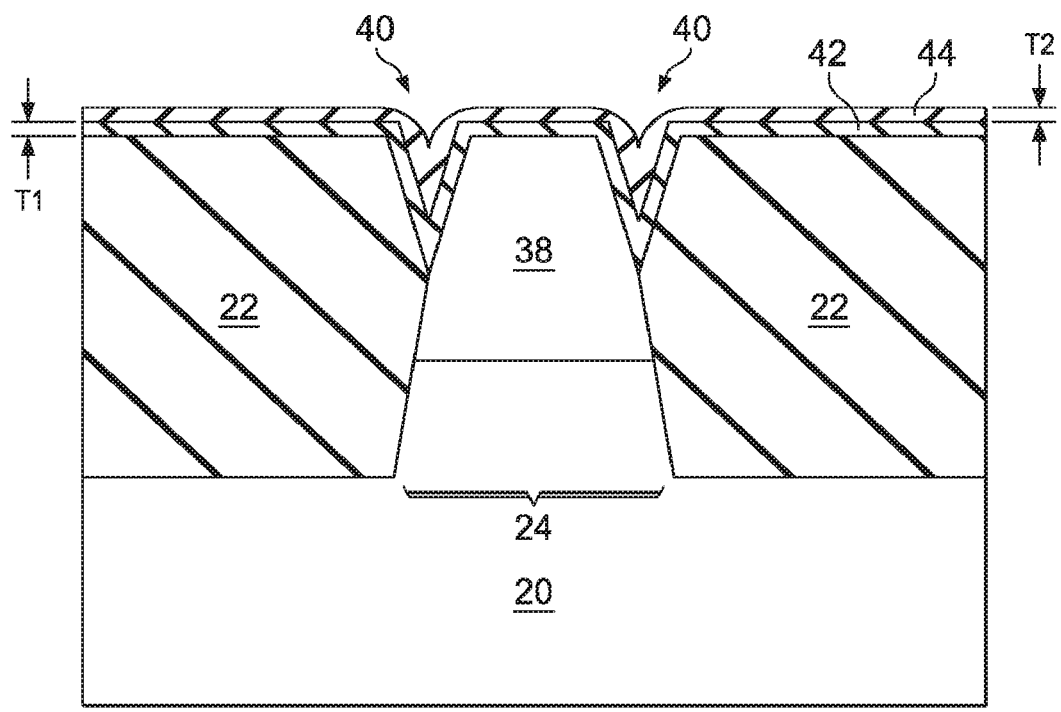

FIGS. 5 through 9B illustrate the remaining processes in the formation of the flash memory cell, wherein the cross-sectional views shown in FIGS. 5 through 9A are obtained from the same plane crossing line 4B-4B in FIG. 4A. Referring to FIG. 5, dielectric layers 42 and 44 are formed. Dielectric layers 42 and 44 are also referred to as a first and a second Resistive Protect Oxide (RPO), respectively, although the materials of dielectric layers 42 and 44 are not necessarily oxides. Dielectric layers 42 and 44 have a high etching selectivity, so that in the subsequent etching of dielectric layer 44, dielectric layer 42 is substantially not etched, and vice versa. In some embodiments, dielectric layer 42 comprises an oxide such as silicon oxide. Dielectric layer 44 may comprise silicon nitride, silicon carbide, silicon oxycarbide, a metal oxide such as Hafnium oxide (HfxOy), zirconium oxide (ZrxOy), aluminum oxide (AlxOy), or combinations thereof, wherein x and y represents a value between, and not including, 0 and 1. Thicknesses T1 and T2 of dielectric layers 42 and 44, respectively, may be between about 20 Å and about 1,000 Å. The formation method may be selected from Plasma Enhanced Chemical Vapor Deposition (PECVD), Low-Pressure Chemical Vapor Deposition (LPCVD), Sub-Atmospheric Chemical Vapor Deposition (SACVD), and the like. Each of dielectric layers 42 and 44 includes portions inside divots 40, and portions outside divots 40 and over STI regions 22 or active region 24. Furthermore, the portions of dielectric layers 42 and 44 in divots 40 are on the sidewalls of STI regions 22 and active region 24.

Figure 6:
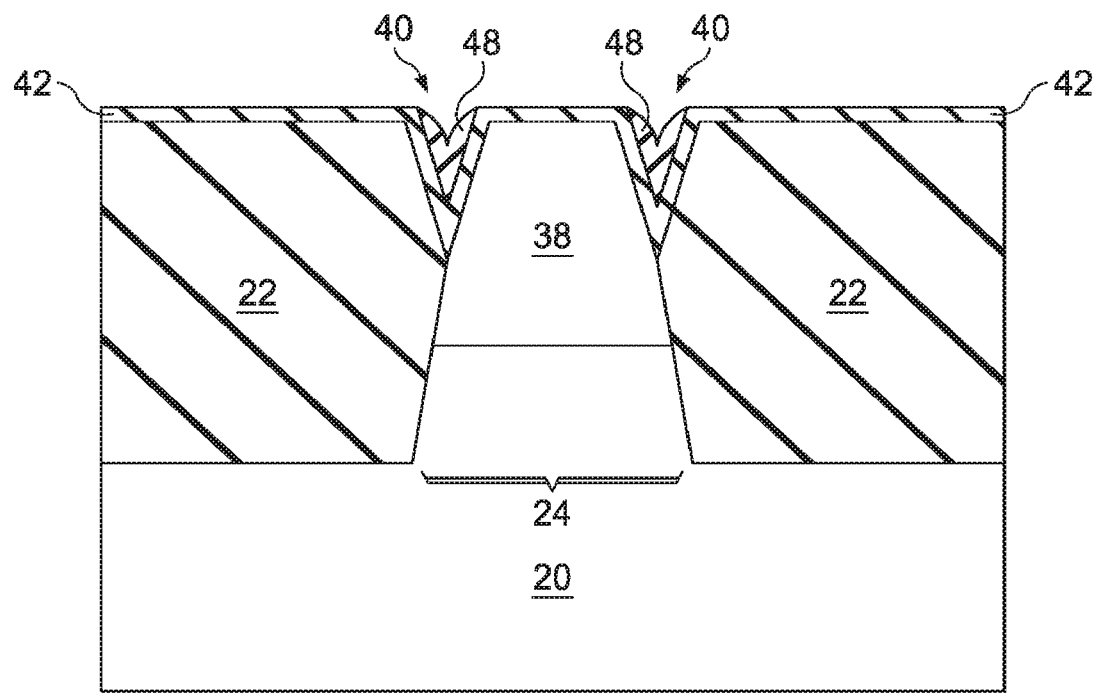

Next, referring to FIG. 6, dielectric layer 44 is etched. In order to perform the etching step, a mask such as a photo resist (not shown) is formed and patterned to cover some regions of the respective wafer, wherein the covered regions may include, for example, an Input/output (IO) device region (not shown). The flash memory region as shown in FIG. 6 is exposed through an opening in the mask. The etching may include a dry etching, a wet etching, or both dry etching and wet etching. In the etching step, portions of dielectric layer 44 outside divots 40 are fully removed. The process conditions of the etching process are controlled, so that the portions of dielectric layer 44 in divots 40 have remaining portions 48. Since there is a high etching selectivity between dielectric layer 42 and 44, dielectric layer 42 is substantially not etched.

Figure 7:
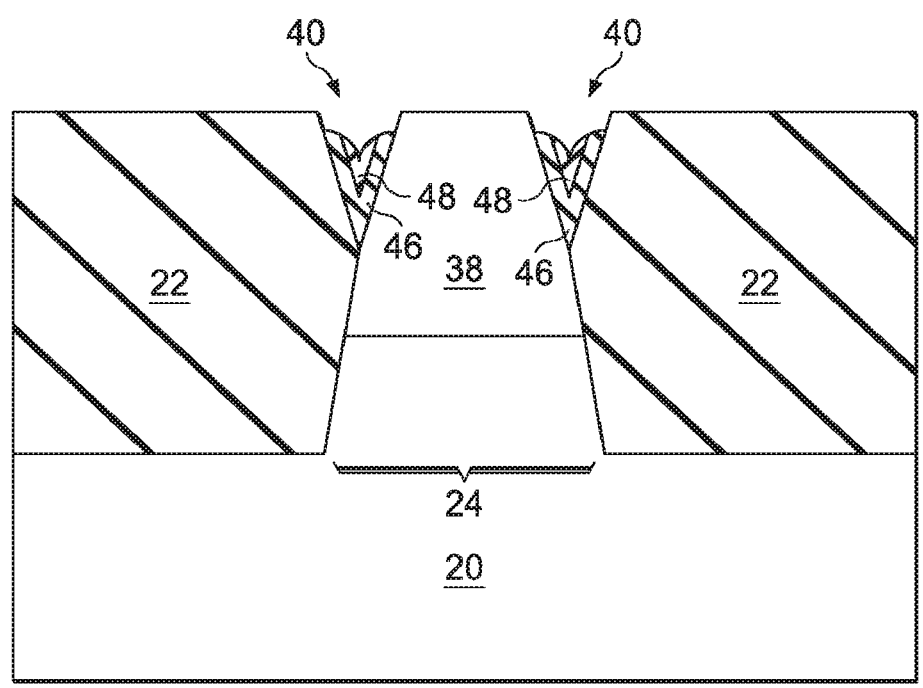

Next, as shown in FIG. 7, dielectric layer 42 is etched. The remaining portions 48 of dielectric layer 44 are used as an etching mask to protect the portions of dielectric layer 42 in divots 40. Accordingly, after the etching process, some portions of dielectric layer 42 remain in divots 40, and are referred to as portions 46 hereinafter. The portions of dielectric layer 42 outside of divots 40 are etched. Throughout the description, remaining portions 46 and 48 are referred to as (sidewall) spacers 46/48 since they are formed on the sidewalls of active region 24 and the sidewalls of STI regions 22. The top ends of spacers 46 and 48 may be lower than the top surfaces of STI regions 22 and active region 24.

It is appreciated that remaining portions 46 may, or may not, be formed of the same material as that of STI regions 22. Regardless of whether remaining portions 46 are formed of the same material as STI regions 22 or not, visible interfaces are formed between remaining portions 46 and STI regions 22, since they are formed in different process steps.

Figure 8A:
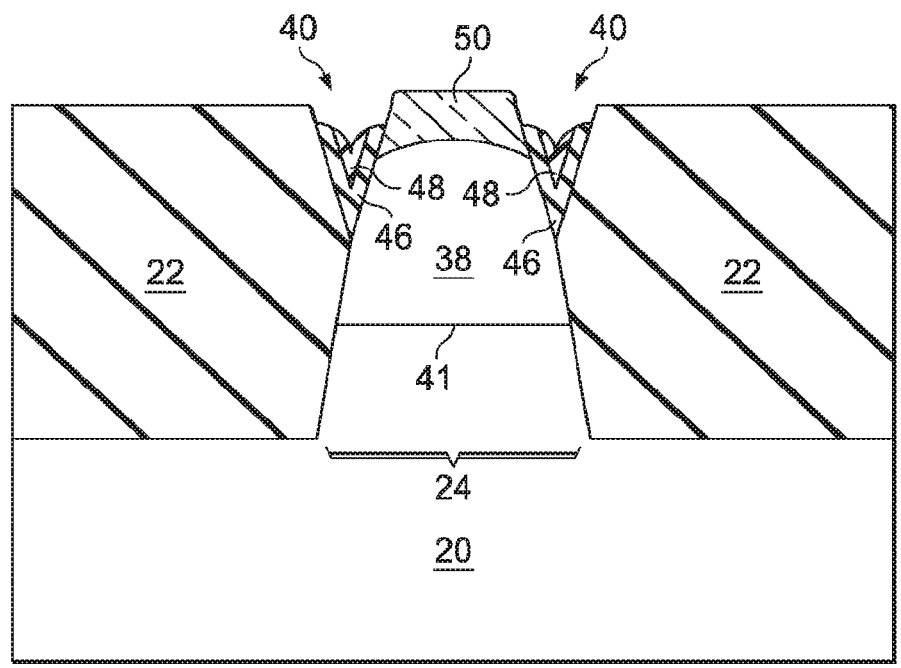

FIG. 8A illustrates the formation of source/drain silicide region 50. To form source/drain silicide region 50, a thin metal layer comprising a metal such as cobalt, nickel, erbium, molybdenum, platinum, or combinations thereof, is blanket deposited. The device is then annealed to form silicide region 50 between the deposited metal and the underlying exposed active region 24 (source/drain region 38). Excess metal is then removed. Silicide region 50 is in physical contact with spacers 46/48. In the resulting structure, since spacers 46/48 protect the sidewalls of active region 24 (source/drain regions 38), the silicidation occurs at the top surface of active region 24 and extending downwardly, rather than at both the top surface and the sidewalls of active region 24. The risk that the silicide region 50 extends to the respective source/drain junction 41 is thus reduced, and the leakage current is accordingly reduced.

Figure 8B:
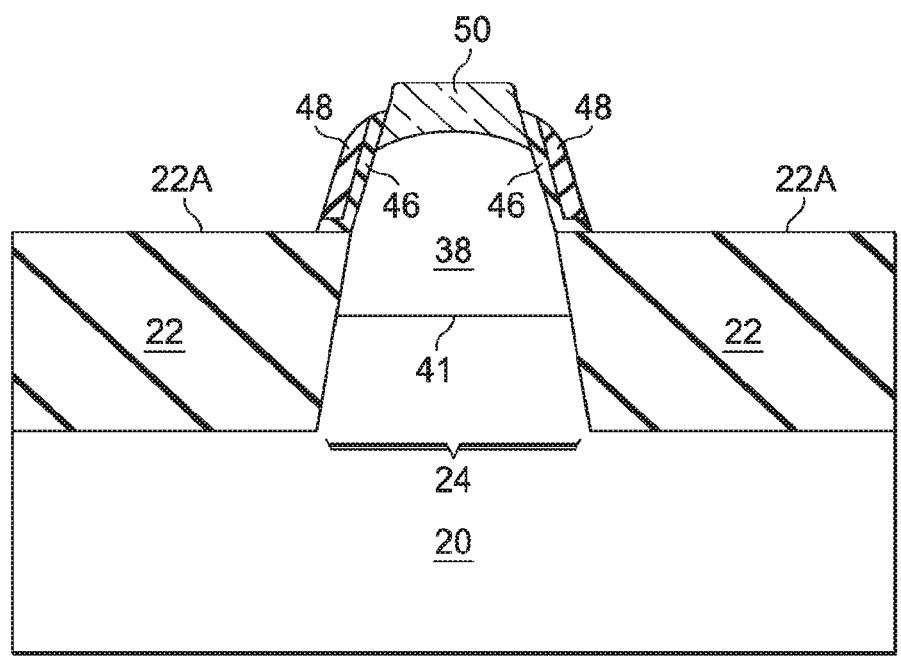

FIG. 8B illustrates a cross-sectional view of the flash memory cell in accordance an alternative embodiments. These embodiments are similar to the embodiments shown in FIG. 8A, except that the top surfaces of 22A of STI regions 22 are substantially flat, and are lower than the top surface of active region 24. Accordingly, spacers 46/48 are formed on the sidewalls of active region 24, and not on the sidewalls of STI regions 22.

In subsequent steps, as shown in FIG. 9A, Contact Etch Stop Layer (CESL) 52, Inter-Layer Dielectric (ILD) 54, and contact plug 56 are formed. CESL 52 may comprise silicon nitride, oxynitride, silicon oxide, or the like. CESL 52 may, or may not, be formed of the same materials as that of either remaining portions 46 or remaining portions 48. Regardless of whether CESL 52 is formed of the same materials as remaining portions 46 or remaining portions 48 or not, visible interfaces are formed between CESL 52 and spacers 46/48 since they are formed in different process steps.

Figure 9B:
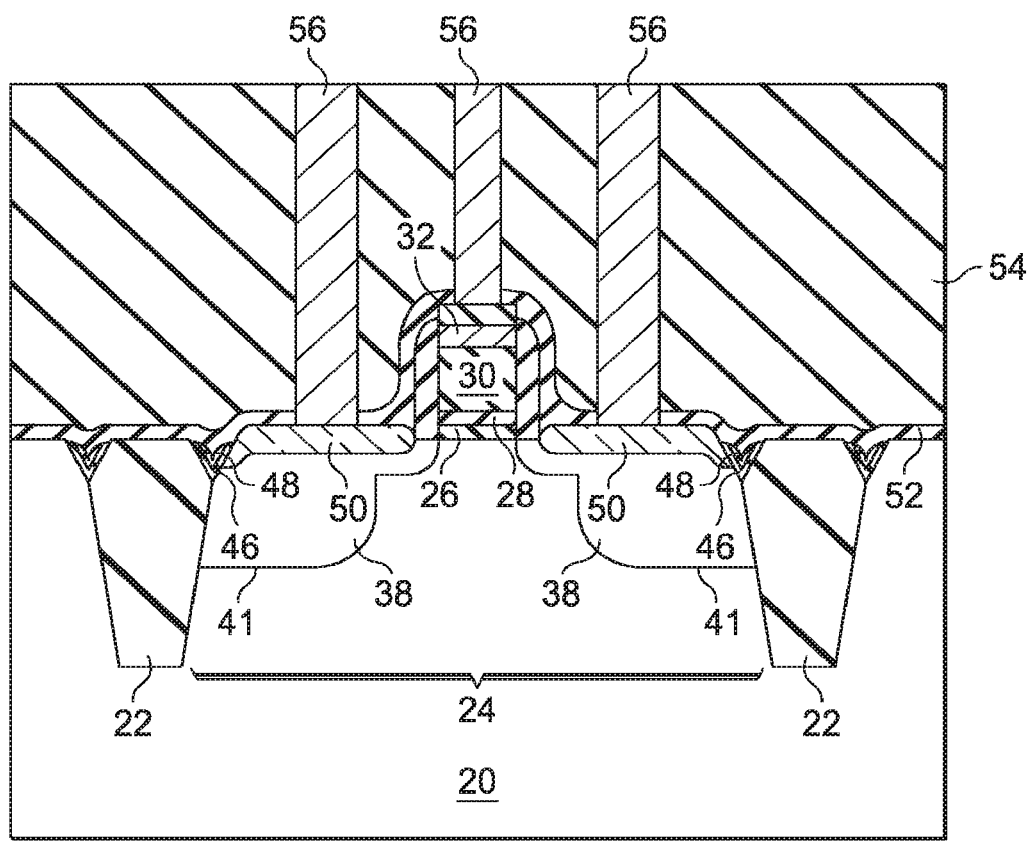

FIG. 9B illustrates a cross-sectional view of the structure shown in FIG. 9A, wherein the cross-sectional view is obtained from the plane crossing line 9B-9B in FIG. 9A. As shown in FIG. 9B, spacers 46/48 may also be formed in the divots that are at the illustrated interface, which interface is formed between a sidewall of active region 24 and STI region 22. Combining FIGS. 9A and 9B, divots 40 and spacers 46/48 may extend to a first side, a second side, and possibly a third side, of active region 24 (and source/drain region 38), with the first and the second sides being opposite to each other, and shown in FIG. 9A, and the third side (FIG. 9B) being connected to ends of the two opposite sides.

In conventional transistors having no spacers in the divots, source/drain silicide regions are formed from the sidewalls of the divots and extending downwardly. Accordingly, source/drain silicide regions extend down deeply, and may punch through the source/drain junctions. The punch-through causes severe source/drain leakage currents. Particularly, flash memory cells include more layers than non-storage transistors. Accordingly, in the formation of the flash memory cells, there are more cleaning processes involved than non-storage transistors. As a result, the respective divots may be deeper, and the leakage currents caused by the punch-through are severe. In the embodiments, by forming spacers on the sidewalls of active regions and in divots, silicide regions are not formed from the sidewalls of the divots, and hence the bottoms of the source/drain silicide regions are higher. The risk of incurring punch-through is thus reduced. The resulting leakage currents flowing through the source/drain regions are hence reduced.

In accordance with embodiments, a device includes a semiconductor substrate including an active region. The active region includes a first sidewall. An isolation region extends from a top surface of the semiconductor substrate into the semiconductor substrate. The isolation region has a second sidewall, wherein a lower portion of the first sidewall joins a lower portion of the second sidewall to form an interface. A dielectric spacer is disposed on an upper portion of the first sidewall. A silicide region is over and contacting the active region. A sidewall of the silicide region contacts the dielectric spacer, and the dielectric spacer has a top surface substantially lower than a top surface of the silicide region.

In accordance with other embodiments, a semiconductor substrate includes a gate stack over the semiconductor substrate, a source/drain region in the semiconductor substrate and on a side of the gate stack, wherein the source/drain region has a first sidewall. An STI region has a second sidewall, wherein a lower portion of the second sidewall is joined with a lower portion of the first sidewall to form an interface. A source/drain silicide region is disposed over and contacting the source/drain region. A divot is formed between sidewalls of the source/drain region, the source/drain silicide region, and the STI region. The divot is connected to a top end of the interface. A dielectric spacer is disposed in the divot and contacting the STI region and the source/drain silicide region.

In accordance with yet other embodiments, a method includes forming a gate stack overlapping a first portion of an active region of a semiconductor substrate, wherein a second portion of the active region adjoins an STI region. A dielectric layer is formed over the second portion of the active region and the STI region. The dielectric layer includes first portions over the second portion of the active region and the STI region, and a second portion in a divot, wherein the divot is formed at an interface between the STI region and the second portion of the active region. The dielectric layer is etched to remove the first portions of the dielectric layer, wherein the second portion remains in the divot after the step of etching. After the step of etching, a silicidation is performed to form a silicide region over the second portion of the active region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a gate stack overlapping a first portion of a semiconductor region, wherein a second portion of the semiconductor region adjoins an isolation region;
   forming a dielectric layer comprising:
      first portions over the second portion of the semiconductor region and the isolation region; and
      a second portion in a divot, wherein the divot is formed at an interface between the isolation region and the second portion of the semiconductor region;
   etching the dielectric layer to remove the first portions of the dielectric layer, wherein the second portion of the dielectric layer remains in the divot as a dielectric spacer, and the dielectric spacer is lower than a top surface of the isolation region; and
   after the etching the dielectric layer, performing a silicidation to form a silicide region over the second portion of the semiconductor region.

2. The method of claim 1 further comprising forming a source/drain region in the second portion of the semiconductor region.

3. The method of claim 1, wherein after the silicidation, the dielectric spacer has a sidewall contacting a sidewall of the silicide region.

4. The method of claim 1, wherein the dielectric spacer is further lower than a top surface of the semiconductor region and a top surface of the isolation region.

5. The method of claim 1, wherein the forming the dielectric layer comprises depositing a first dielectric layer and depositing a second dielectric layer over the first dielectric layer, and wherein the etching comprises:
   etching the second dielectric layer, wherein portions of the second dielectric layer over the isolation region and the second portion of the semiconductor region are removed, and a remaining portion of the second dielectric layer in the divot remains in the divot after the step of etching; and
   etching the first dielectric layer using the remaining portion of the second dielectric layer as an etching mask.

6. The method of claim 1 further comprising:
   after the silicidation, forming an Inter-Layer Dielectric (ILD) over the second portion of the dielectric layer, the silicide region, and the isolation region; and
   forming a contact plug in the ILD, wherein the second portion of the dielectric layer remains in the divot after the contact plug is formed.

7. The method of claim 1, wherein the forming the gate stack comprises:
   forming a tunneling layer over the semiconductor region;
   forming a storage layer over the tunneling layer;
   forming a blocking layer over the storage layer;
   forming a control gate layer over the blocking layer; and
   patterning the control gate layer, the blocking layer, the storage layer, and the tunneling layer to form the gate stack.

8. The method of claim 1, wherein after the etching the dielectric layer, the first portions of the dielectric layer are fully removed.

9. The method of claim 1, wherein after the etching the dielectric layer, an entirety of the dielectric spacer is in the divot.

10. A method comprising:
    forming an isolation region having a first sidewall comprising a lower portion and an upper portion, wherein the lower portion of the first sidewall contacts a lower portion of a second sidewall of a semiconductor region, and a divot is formed between the upper portion of the first sidewall and an upper portion of the second sidewall;

forming a dielectric layer covering the semiconductor region and the isolation region, wherein the dielectric layer comprises a portion extending into the divot, and the forming the dielectric layer comprises:

depositing a first layer contacting the semiconductor region and the isolation region; and depositing a second layer over the first layer, wherein the first layer and the second layer have a distinguishable interface therebetween; and etching the dielectric layer to remove portions of the dielectric layer covering the semiconductor region and the isolation region, wherein the portion of the dielectric layer extending into the divot is left as a dielectric spacer, and the etching the dielectric layer comprises:

a first etching step for etching the second layer; and a second etching step for etching the first layer, wherein in the second etching step, remaining portions of the second layer is used as an etching mask.

11. The method of claim 10, wherein the first layer and the second layer are formed of different materials.

12. The method of claim 2, wherein after the first etching step and the second etching step, a top end of a remaining portion of the first layer is higher than an entirety of remaining portions of the second layer.

13. The method of claim 10, wherein the dielectric spacer is lower than a top surface of the semiconductor region and a top surface of the isolation region.

14. The method of claim 10, wherein after the second etching step, a remaining portion of the second layer is left covering a remaining portion of the first layer, and the remaining portion of the second layer and the remaining portion of the second layer in the divot in combination form the dielectric spacer.

15. A method comprising:

forming an isolation region extending into a semiconductor substrate;

forming stacked layers over the isolation region and the semiconductor substrate;

patterning the stacked layers to form a gate stack;

forming gate spacers on sidewalls of the gate stack;

forming a source/drain region in the semiconductor substrate, wherein the source/drain region adjoins the isolation region;

depositing a dielectric layer covering the source/drain region and the isolation region;

forming a dielectric spacer in a divot, wherein the dielectric spacer is between and contacting a sidewall of the source/drain region and a sidewall of the isolation region, and a topmost end of the dielectric spacer is lower than a top surface of the isolation region; and siliciding a top portion of the source/drain region to form a silicide layer, wherein the dielectric spacer contacts a sidewall of the silicide layer.

16. The method of claim 15, wherein the topmost end of the dielectric spacer is further lower than a top surface of the silicide layer.

17. The method of claim 15, wherein the forming the dielectric spacer comprises:

depositing a dielectric layer to overlap the source/drain region and the isolation region; and etching the dielectric layer.

18. The method of claim 15, wherein the dielectric spacer comprises a lower layer and an upper layer over the lower layer, wherein the lower layer and the upper layer are formed of different materials.

19. The method of claim 18, wherein a top end of the lower layer protrudes higher than the upper layer.

20. The method of claim 15 further comprising forming a dielectric etch stop layer over and in contact with the source/drain region, the dielectric spacer, and the isolation region.

* * * * *